United States Patent [19]

Smith et al.

[11] 4,153,740

[45] May 8, 1979

[54] ORGANO-SULFUR COMPOSITION FOR FORMING THERMOPARTICULATING COATING

[75] Inventors: James D. B. Smith, Wilkins Township, Allegheny County; Joseph F. Meier, Export; David C. Phillips, Penn Hills Township, Allegheny County, all of Pa.

[73] Assignee: Westinghouse Electric Corp., Pittsburgh, Pa.

[21] Appl. No.: 868,576

[22] Filed: Jan. 11, 1978

Related U.S. Application Data

[62] Division of Ser. No. 699,561, Jun. 24, 1976, Pat. No. 4,100,327.

[51] Int. Cl.² .................................................. G01N 15/06
[52] U.S. Cl. .................................................. 427/8; 73/28; 427/58
[58] Field of Search ............................ 427/8, 58; 73/28

[56] References Cited

U.S. PATENT DOCUMENTS

| 3,955,417 | 5/1976 | Smith et al. | 73/339 R |
| 3,957,014 | 5/1976 | Phillips et al. | 73/28X |
| 3,973,438 | 8/1976 | Smith et al. | 73/28 X |
| 4,046,733 | 9/1977 | Smith et al. | 73/28 X |

*Primary Examiner*—James R. Hoffman
*Attorney, Agent, or Firm*—R. D. Fuerle

[57] ABSTRACT

A composition is disclosed of a non-metallic, non-ionic organo-sulfur compound, a resinous carrier, and a solvent. The composition is applied to a portion of an electrical apparatus which is exposed to a gas stream. The solvent in the composition is evaporated to produce a thermoparticulating coating. When the electrical apparatus overheats, the organo-sulfur compound in the coating forms particles in the gas stream which are detected by the monitor.

20 Claims, No Drawings

ORGANO-SULFUR COMPOSITION FOR FORMING THERMOPARTICULATING COATING

This is a division, of application Ser. No. 699,561 filed June 24, 1976, now U.S. Pat. No. 4,100,327.

CROSS-REFERENCES TO RELATED APPLICATIONS

This application is related to application Ser. No. 634,217, filed Nov. 21, 1975, by J. D. B. Smith, J. F. Meier, and D. C. Phillips, entitled "Metal Dithiocarbamate Compositions For Forming Thermoparticulating Coating,", now U.S. Pat. No. 4,056,006. That application the use of compounds having the general formula

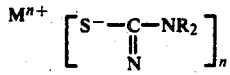

(where M is a metal and R is H, alkyl, etc.) as thermoparticulating compounds in generators.

BACKGROUND OF THE INVENTION

Electrical apparatus, such as motors and turbine generators, occasionally overheat due to shorts or other malfunctions. The longer the overheating continues the more damage is done to the apparatus. A malfunction detected immediately may mean only a quick repair but if the overheating continues, the entire machine may be damaged.

Large rotating electrical apparatus is usually cooled with a hydrogen gas stream. The organic compounds in the apparatus are first to be effected by the overheating and they decompose to form particles which enter the gas stream. Monitors then detect particles in the gas stream and sound a warning or shut down the apparatus when too many particles are detected.

Descriptions of such monitors and how they function may be found in U.S. Pat. No. 3,427,880 entitled "Overheating Detector For Gas Cooled Electrical Machine" and in U.S. Pat. No. 3,573,460 entitled "Ion Chamber For Submicron Particles." Another monitor, "The Condensation Nuclei Detector," is described by F. W. VanLuik, Jr. and R. E. Rippere in an article entitled "Condensation Nuclei, A New Technique For Gas Analysis," in Analytical Chemistry 34,1617 (1962) and by G. F. Skala, in an article entitled "A New Instrument For The Continuous Detection Of Condensation Nuclei," in Analytical Chemistry 35, 702 (1963).

As U.S. Pat. Nos. 3,427,880 and 3,807,218 suggest, special coatings may be applied to the apparatus which decompose and form detectable particles at a lower temperature than the usual organic compounds found in the apparatus. For example, those patents mention polyalphamethylstyrene, polystyrene, polymethyl) methacrylate, and cellulose propionate which decompose to form particles at 230 to 340° C. Unfortunately, since these machines normally operate at about 50° to 100° C., they may be severely damaged by the time the temperature reaches 230° to 340° C.

Efforts to identify materials which will decompose to form detectable particles (i.e., thermoparticulate) at temperatures closer to the operating temperature of the machine have met with several difficulties. Many compounds, such as succinic acid, maleic acid, fumaric acid, and polyacrylic acid, do not decompose below 190° C. Others such as acetic acid, are liquids which boil and therefore are unsuitable. Some compounds, such as oxalic acid, decompose at a low temperature but the decomposition products do not include detectable particles. Compounds such as 1,2-diformylhydrazine have some of the desirable properties but cannot withstand several years operation at 50° to 100° C. A few compounds contain toxic or corrosive substances in their decomposition products which may render them unsuitable.

SUMMARY OF THE INVENTION

We have found that certain organo-sulfur compounds can be used in a composition to form a thermoparticulating coating. The coating can be made compatible with the other organic compounds in the apparatus. The coating is very stable and can withstand several years operation at 60° or 80° C. (depending on the particular organo-sulfur compound used) without decomposing, yet still produce detectable particles when the temperature reaches about 150° to 200° C. (depending on the particular organo-sulfur compound used). Also, when the coating is heated to about the thermoparticulating temperature of the coating it blisters and becomes a very dark brown or black color which is a considerable aid in locating the malfunction.

The thermoparticulation products of certain organo-sulfur compounds are expected to give a distinctive "fingerprint" in a mass spectrometer because of their unusual chemical structure. This is very useul because it can pinpoint the exact area in the generator that is being overheated, which is very helpful in repairing the defect. Also, some of these compounds have a lower thermoparticulation temperature after aging, which is unique among the thermoparticulating compounds so far discovered.

DESCRIPTION OF THE INVENTION

A composition is prepared of an organo-sulfur compound in a solution of a resinous carrier. The organo-sulfur compound may be dispersed if it is insoluble in the solvent (e.g., toluene) or it may be in solution if it is soluble in the solvent (e.g., ethyl alcohol or diethyl ether). Dispersions are preferred as they produce much more particulation than do solutions. A particle size of the dispersed organo-sulfur compound of about 25 to about 1000 microns is suitable.

The composition may be prepared by simply mixing the ingredients, but it is preferable to mix the drier, resinous carrier, and solvent first and then add the organo-sulfur compound to prevent the occlusion of the drier in the organo-sulfur compound and thereby obtain a more homogeneous dispersion of the organo-sulfur compound.

A suitable composition is a resinous carrier, about 20 to about 250 phr (parts by weight per hundred parts of resinous carrier) of the organo-sulfur compound, and about 25 to about 75% (by weight based on the resinous carrier) of a solvent for the resinous carrier. If the amount of organo-sulfur compound is less than about 20 phr, the quantity of particles given off during decomposition may be too low to be detected by presently-existing detectors. However, the construction of more sensitive detectors would permit a lower amount of organo-sulfur compound. If the amount of organo-sulfur compound exceeds about 250 phr, the composition is thick, difficult to apply, and does not bond well. The preferred amount of organo-sulfur compound, which generally gives the best results, is about 40 to about 60 phr. If the amount of solvent is less than about 25%, the composition is generally too viscous to apply easily and if the amount of solvent is greater than about 75%, the composition is unnecessarily dilute and the coating may be too thin to produce an adequate number of particles during decomposition, at least while the malfunction is highly localized. Best results are usually obtained with about 45 to about 55% solvent.

The composition also preferably contains about 0.1 to about 3 phr of a drier when the resinous carrier is an epoxy resin or similar resin, to promote its room temperature cure. Lead naphthenate or cobalt naphthenate is preferred although stannous octoate, zinc stearate, etc. could also be used. Resins such as polyesters may also require the presence of an organic peroxide as is known in the art. Mixtures of various resins, solvents, or driers are also contemplated.

The thermoparticulating compounds of this invention are organo-sulfur compounds. The organo-sulfur compounds must decompose between about 60° and about 200° C. and produce particles larger than about 25A, in order for the particles to be detected with presently-existing monitors. Also, the organo-sulfur compound is non-metallic and non-ionic (i.e., it is covalent). It has at least one carbon atom which is bonded directly to a nitrogen atom and to two sulfur atoms and directly to no other atoms, and therefore it contains one or both of the groups:

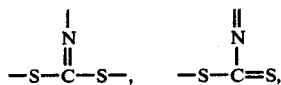

The group

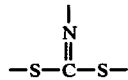

preferably occurs in the larger group

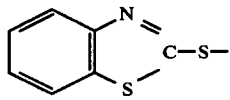

as these compounds are readily available. More specifically, the organo-sulfur compounds which are preferred due to their availability, low cost, and good aging characteristics, have the general formulae:

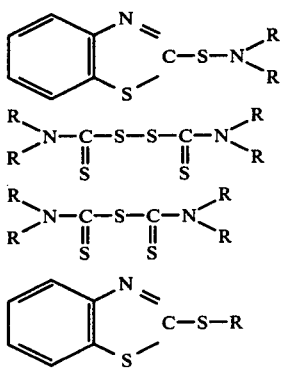

where each R is independently selected from hydrogen, alkyl to $C_8$, aryl, aralkyl, or heterocyclic. Also, two R groups may together form a ring. Examples of suitable compounds are given in the Examples. All of the compounds given in the Examples are commercially available and several are used as accelerators and curvatives in the manufacture of rubber. (See the Vanderbilt Rubber Handbook, pages 241 to 244; 1968.) Mixtures of organo-sulfur compounds are also contemplated.

The resinous carrier performs the function of bonding the organo-sulfur compound to the apparatus since a coating of the organo-sulfur compound by itself does not adhere well. The resinous carrier should be compatible with the other resins used in the apparatus and therefore it is usually advantageous to use the same resin used elsewhere. The resinous carrier is curable at 60° C. and is preferably air-dryable since it cannot be easily cured in place with heat. Also, it should be stable after curing for several years at 60° C. The resin must be substantially unreactive with the organo-sulfur compound for otherwise suitable thermoparticulation will not occur. The organo-sulfur compound and the resin form a mixture and the organo-sulfur compound does not catalyze the cure of the resin. Epoxy resins are preferred as they are usually used elsewhere in the apparatus, but polyesters, silicone rubber, polystyrene, etc., could also be used.

The solvent for the resinous carrier depends on the particular resinous carrier used. Toluene, xylene, benzene, methyl ethyl ketone, ethyl alcohol, diethyl ether, acetone, cellosolve, etc., are common solvents that may be used. Toluene is preferred as it is inexpensive and dissolves most resins. It would be preferable if the solvent could be eliminated, but as yet no suitable air-dryable liquid resins are available.

The composition is applied to portions of the electrical apparatus which are exposed to the gas stream. The coating does not function as insulation and is usually applied on top of insulation, but it can also be applied to conductors. The application may be made by brushing, spraying, dipping, grease gun, troweling, or other techniques. A suitable coating thickness (after drying) as about 1/16 to about ½ inch. The dispersed particles of organo-sulfur compound should not be covered with excessive resinous carrier as that may prevent the decomposition particles from escaping into the gas stream. After evaporation of the solvent and room temperature cure of the resinous carrier, if necessary, the apparatus is ready to be operated. When thermoparticulation and the resulting alarm occur, a sample of the gas stream can be collected and analyzed. Since different organo-sulfur compounds and other thermoparticulating compounds can be used in different areas of the apparatus and their thermoparticulation products are different, analysis of the sample can pinpoint the location of the overheating.

The compositions of this invention are useful in areas of generators which are not subject to temperatures much in excess of 60° or 80° C. (depending on the particular organo-sulfur compound used). Such areas include the outside surface of the stator windings at the exciter end of a 2-pole, gas-cooled machine with radial gas flow (i.e., at the "cool" end), the outside surface of the stator windings at the exciter end of a water-cooled, 4-pole machine with axial core ventilation, and on the cool end of the stator coil of a 4-pole, gas-cooled machine with axial core ventilation.

The following examples further illustrates this invention.

EXAMPLE 1

The following composition was prepared using various organo-sulfur compounds.

| Organo-sulfur Compound | Formula | Aging Condition | Organo-particulation Temperature Range ° C. |
|---|---|---|---|
| Benzothiazole Disulfide | $(C_6H_4SCN)_2S_2$ | 1 day at 60° C. | 170–175 |
| | | 7¾ mo. at 60° C. | 166–171 |
| | | 3 mo. at 80° C. | 179–183 |
| | | 4½ mo. at 100° C. | 182–188 |
| N-Oxydiethylene 2-Benzothiazole Sulfenamide | $C_6H_4SCNSN(CH_2)_4O$ | 1 day at 60° C. | 180–185 |
| | | 7¾ mo. at 60° C. | 171–177 |
| | | 3 mo. at 80° C. | 190 |
| N-Cyclohexyl-2-Benzothiazole Sulfenamide | $C_6H_4SCNSNHC_6H_{11}$ | 1 day at 60° C. | 163–167 |
| | | 7¾ mo. at 60° C. | 157–163 |
| | | 3 mo. at 80° C. | 181–185 |
| Tetramethylthiuram Disulfide | $[(CH_3)_2NCS]_2S_2$ | 1 day at 60° C. | 160–164 |
| | | 7¾ mo. at 60° C. | 161–163 |
| | | 3 mo. at 80° C. | 190 |
| 2(Morpholinothio) Benzothiazole | $C_{11}H_{12}N_2OS_2$ | 1 day at 60° C. | 177–185 |
| N-Tertiarybutyl 2-Benzothiazole Sulfenamide | $C_6H_4SCNSNC(C_4H_9)_3$ with H | 1 day at 60° C. | 159–163 |
| Tetramethylthiuram Monosulfide | $[(CH_3)_2NCS]_2S$ | 1 day at 60° C. | 160–163 |
| 2,2'-Dithio Bis (Benzothiazole) | $(C_6H_4SCN)_2S_2$ | 1 day at 60° C. | 160–165 |
| 2-Mercapto Benzothiazole | $C_6H_4SCNSH$ | 1 day at 60° C. | 162–167 |

| | Parts by Weight |
|---|---|
| Organo-sulfur compound | 100 |
| Epoxy resin, 50% solids in toluene, made from 200 pbw (parts by weight) linseed fatty acids, 200 pbw styrene, and 300 pbw diglycidyl ether of Bisphenol A, sold by Westinghouse Electric Corportation as "B-276" Varnish (See Example I of U.S. Patent 2,909,497 for detailed description) | 100 |
| 6% solution in low boiling hydrocarbons of cobalt naphthenate | 1.0 |
| 24% solution in low boiling hydrocarbons of lead naphthenate | 0.25 |

The cobalt and lead naphthenate solutions were added to the epoxy resin prior to the addition of the organo-sulfur compound.

Samples were prepared by brushing the above composition onto 3 inch by 1 inch aluminum sheets 1/16 to ¼ inches thick. The samples were dried overnight at 60° C. to form coatings ¼ inches thick, then placed in a forced-air oven at 60° or 80° C. for various periods to determine if they were stable and would function after aging.

The samples were placed one at a time in a stainless steel boat within a 1 inch o.d. stainless steel tube. Hydrogen was passed over the samples at flow rate of 6-l/min. A phase-controlled temperature regulator and programmer controlled the temperature in the boat and the temperature in the boat was measured by mounting a hot junction chromel-alumel thermocouple within a small hole in the boat. The output of the thermocouple and the detector were monitored on a two-pen potentiostatic recorder. A 6° C./min. heating rate was maintained in each experiment after the insertion of the sample in the boat. The threshold temperature at which considerable particulation occurred was taken from the chart produced in the boat. The threshold temperature at which considerable particulation occurred was taken from the chart produced by the recorder. The occurrence of particulation was detected using a Generator Condition Monitor Detector sold by Environment One Corporation.

The following table gives the results:

We claim:

1. A method of protecting electrical apparatus from damage due to overheating and for thereafter determining the location of said overheating, said apparatus including a gas stream and a monitor for detecting particles in said gas stream and for emitting a signal when said particles are detected comprising:
   (A) preparing a composition which comprises at least one non-metallic, non-ionic (covalent) organo-sulfur compound containing the group

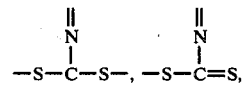

or mixtures thereof, and a solution of a resinous carrier curable at room temperature and stable at 60° C., and unreactive with said organo-sulfur compound at its thermoparticulation temperature;
   (B) applying said composition to said electrical apparatus at positions exposed to said gas stream;
   (C) evaporating said solvent; and
   (D) monitoring said gas stream for the presence of particles therein.

2. A method according to claim 1 including the additional last step of inspecting said apparatus visually for blistered and darkened areas, after a signal has been emitted, to locate the area of overheating.

3. A method according to claim 1 including the additional last steps of collecting a sample of said gas stream after a signal has been emitted, and analyzing said sample.

4. A method according to claim 1 wherein

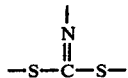

group occurs in the group

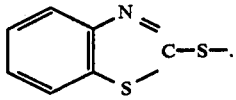

5. A method according to claim 1 wherein said compound has the general formula:

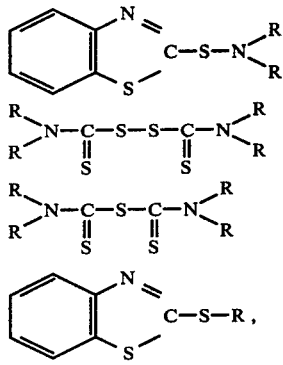

or mixtures thereof wherein each R is independently selected from hydrogen, alkyl to $C_8$, aryl, aralkyl, or heterocyclic.

6. A method according to claim 1 wherein the amount of said compound is about 20 to about 250 phr and the amount of the solvent in said solution is about 25 to about 75% (by weight based on said resinous carrier).

7. A method according to claim 6 wherein the amount of said compound is about 40 to about 60 phr and the amount of said solvent is about 45 to about 55% (by weight based on said resinous carrier).

8. A method according to claim 1 wherein said resinous carrier is an epoxy resin.

9. A method according to claim 8 wherein said composition includes about 0.1 to about 3 phr of a drier for said epoxy resin.

10. A method according to claim 9 wherein said coating is prepared by first mixing said solution of resinous carrier and said drier and then mixing in said organo-sulfur compound.

11. A method according to claim 1 wherein the solvent in said solution is toluene.

12. A method according to claim 1 wherein said organo-sulfur compound is dispersed in said solution.

13. A method according to claim 1 wherein said resinous carrier is air-dryable.

14. A thermal detection system for electrical apparatus cooled by a gas stream, comprising a coating on a portion of said electrical apparatus exposed to said gas stream and a monitor for detecting the presence of particles in said gas stream, said coating comprising a solid layer of a cured resinous carrier containing a non-metallic, non-ionic (covalent) organo-sulfur compound containing the group

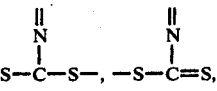

or mixtures thereof, said resinous carrier being stable at 60° C. and unreactive with said organo-sulfur compound at its thermoparticulation temperature.

15. A thermal detection system according to claim 14 wherein said

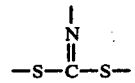

group occurs in the group

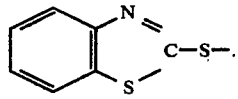

16. A thermal detection system according to claim 14 wherein said compound has the general formula:

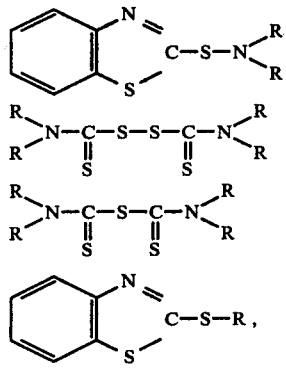

or mixtures thereof wherein each R is independently selected from hydrogen, alkyl to $C_8$, aryl, aralkyl, or heterocyclic.

17. A thermal detection system according to claim 14 wherein the amount of said compound is about 20 to about 250 phr.

18. A thermal detection system according to claim 17 wherein the amount of said compound is about 40 to about 60 phr.

19. A thermal detection system according to claim 14 wherein said resinous carrier is an epoxy resin.

20. A thermal detection system according to claim 19 wherein said coating includes about 0.1 to about 3 phr of a drier for said epoxy resin.

* * * * *